(12) United States Patent
Huon et al.

(10) Patent No.: US 6,630,865 B2
(45) Date of Patent: Oct. 7, 2003

(54) PUSH-PULL AMPLIFIERS

(75) Inventors: Graeme John Huon, Mt Waverly (AU); Walter Melville Dower, Mt Dandenong (AU)

(73) Assignee: Techstream Pty., Ltd., Rowville (AU)

( * ) Notice: Subject to any disclaimer, the term of this patent is extended or adjusted under 35 U.S.C. 154(b) by 0 days.

(21) Appl. No.: 10/313,002

(22) Filed: Dec. 6, 2002

(65) Prior Publication Data

US 2003/0102918 A1 Jun. 5, 2003

Related U.S. Application Data

(63) Continuation of application No. PCT/AU01/00676, filed on Jun. 7, 2001.

(30) Foreign Application Priority Data

Jun. 7, 2000 (AU) .............................................. PQ8010

(51) Int. Cl.$^7$ ................................................. H03F 3/26
(52) U.S. Cl. ........................ 330/262; 330/271; 330/273; 330/274; 330/300
(58) Field of Search ................................. 330/262, 271, 330/273, 274, 300

(56) References Cited

U.S. PATENT DOCUMENTS

| | | |
|---|---|---|
| 4,431,972 A | 2/1984 | Ishii et al. |
| 4,572,970 A | 2/1986 | Allen et al. |
| 5,729,178 A | 3/1998 | Park et al. |
| 5,874,858 A * | 2/1999 | Furuya ........................ 330/262 |

FOREIGN PATENT DOCUMENTS

JP          406204759      *   7/1994

OTHER PUBLICATIONS

Sun et al. "Zero Voltage Soft–Commutation PWM DC—DC Converter with Saturable Reactor Switch–Cascaded Diode Rectifier" IEEE Transactions on Circuits + Systems vol. 45 Issue 4, Apr. 1998 pp. 348–354.*

* cited by examiner

Primary Examiner—Michael B Shingleton
(74) Attorney, Agent, or Firm—Foley & Lardner

(57) ABSTRACT

A push pull amplifier is disclosed having upper and lower output devices operating in a mode in which the devices drive a load alternately. The amplifier includes bias means for providing a bias current to the output devices at all times. The bias means is incorporated in a feedback loop and is arranged such that transitions from load current to minimum bias current in the upper and lower output devices are sufficiently gradual so that harmonic frequencies generated by the transitions are within the capability of the amplifier under all signal conditions. The feedback loop includes a non-linear transform circuit for each upper and lower output device to prevent the bias current reducing to zero. The feedback loop also includes a linearity control circuit for controlling the harmonic frequencies in the upper and lower output devices.

7 Claims, 5 Drawing Sheets

PUSH-PULL AMPLIFIERS

This application is a continuation of PCT/AU01/00676 filed Jun. 7, 2001.

FIELD OF THE INVENTION

The present invention relates to amplifiers and in particular amplifiers which are of a push-pull type.

BACKGROUND OF THE INVENTION

Many power amplifiers are of a push-pull type. Push pull denotes that load current is shared between output devices in the push pull amplifier. The load current is shared so that one or more output devices on an upper or positive side of a common or zero voltage reference (hereinafter referred to as "upper device") sources the load current when the drive signal is positive in polarity, and one or more output devices on a lower or negative side of the common voltage reference (hereinafter referred to as "lower device"), sinks the load current when the drive signal is negative in polarity.

In amplifier designs for audio applications high fidelity is often of paramount importance. One factor affecting fidelity is distortion and in particular transient distortion for assymetric signals. Crossover distortion in particular has long been recognised as a difficult problem. Various techniques have been used to reduce crossover distortion and some manufacturers claim distortion levels of 0.0002% or better. Low distortion is a differentiator in the market place for high fidelity amplifiers that separates the best products from competing ones.

A traditional approach to reducing crossover distortion in amplifiers has been to increase bias current. This reduces the risk that output devices will turn off and contribute to crossover distortion and moves the transfer function to a steeper slope region of the output devices thus improving available gain. However, such an option is not viable with integrated circuit power amplifiers because of heat dissipation constraints.

Recent advances in the art make use of the orthogonal property of the bias current with respect to the load current to allow a continuously varying bias current instead of a steady bias current. The orthogonal property refers to the condition wherein the load current will not change if the upper and lower device currents are changed or "pushed" simultaneously by the same amount as happens, for example, when a steady bias current is increased. This occurs because the load current in a push-pull amplifier is the difference between the upper and lower device currents. Hence the bias or "push-push" current is invisible to the load or "push-pull" current. The prior art includes varying the bias current instantaneously with the signal by means of a supplementary internal feedback loop which attempts to maintain conduction of upper and lower output devices at all times. A non-linear control function is used to produce a somewhat gradual transition to the minimum conduction or bias state. The non-linear control function provides a practical means of migrating from load current to minimum conduction condition in the output devices but without regard to the harmonic frequencies generated in the currents of the output devices. Using this approach distortion figures are typically around 0.01%. To be competitive with the best designs a 30 fold improvement in distortion figures is required. It is anticipated that, applied properly, the approach of the present invention has the potential to provide at least a 30 fold improvement.

SUMMARY OF THE INVENTION

In the prior art it has been assumed that a diode junction or emitter base junction provides an acceptable non-linear control function. Fundamentally, the present invention lies in a recognition of the need to control harmonic frequencies generated by transitions from load current to minimum bias current in the output devices of an amplifier. An amplifier according to the present invention may include a bias control circuit for controlling the harmonic frequencies which are generated during the transitions. The bias control circuit may be incorporated in a negative feedback loop to dynamically control the bias current. The feedback loop may be combined with an appropriate non-linear control function. The present invention requires that harmonic frequencies generated in the currents of its output devices during the transitions be within the capability of the amplifier. The harmonics generated by the transitions from load to minimum bias current should be controlled to be within the frequency response of the amplifier and to be within the amplifier's capability to maintain adequate loop gain during the transitions. For a given idle bias current setting, adequate loop gain may be achieved by controlling the harmonic frequencies generated during the transitions from load to minimum bias current.

Harmonic frequencies may be controlled by shaping the non-linear characteristic of the control function. Characteristics of the control function may be shaped by introducing a linearity control circuit in combination with a non-linear transform circuit to moderate relative linearity of the control function. The linearity control circuit may include at least one shaping element such as a resistor and may be situated such that it creates a voltage drop which is sensed as part of the input signal to the non-linear transform circuit. The linearity control circuit may contain a network of components in the form of a shaping circuit to provide a required transfer function in the bias feedback loop to control the harmonic frequencies. The network may include one or more resistors, diodes and transistors.

According to the present invention there is provided a push pull amplifier having upper and lower output devices operating in a mode in which said devices drive a load alternately, said amplifier including bias means for providing a bias current to said devices at all times, said bias means being incorporated in a feedback loop and being arranged such that transitions from load current to minimum bias current in said upper and lower output devices are sufficiently gradual so that harmonic frequencies generated by said transitions are within the capability of said amplifier under all signal conditions, said feedback loop including non-linear transform means for each said upper and lower output device to prevent said bias current reducing to zero and linearity control means for controlling the harmonic frequencies in said upper and lower output devices.

DESCRIPTION OF THE PREFERRED EMBODIMENTS

Preferred embodiments of the present invention will now be described with reference to the accompanying drawings wherein.

Figure 1:
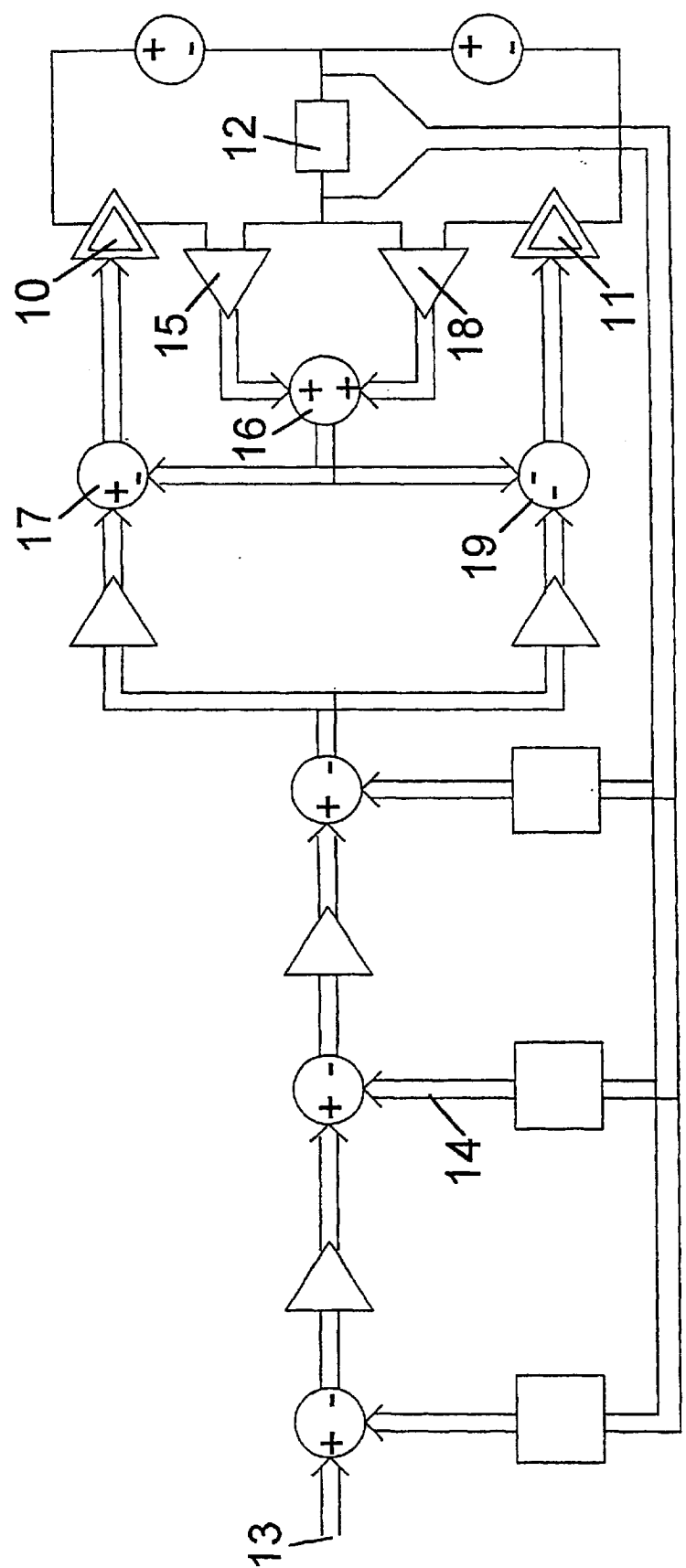
FIG. 1 shows a generalized amplifier configuration utilizing fast automatic biasing.

As FIG. 1 provides a generalised representation, the paths shown with double lines may be current or voltage feeds and the gain blocks may be voltage, current, trans-conductance or trans-resistance amplifiers as appropriate. Output devices 10 and 11 control current to load 12. Negative feedback modifies input voltage 13 via an overall loop and may include one or more nested differentiating feedback loops 14. Bias current is provided by means of interacting feedback loops 15-16-17-10 and 18-16-19-11 for output devices 10 and 11 respectively. Gain blocks 15 and 18 sense and amplify the currents in output devices 10 and 11 non-linearly. The resulting signals from gain blocks 15 and 18 are summed in node 16 to produce bias control, which is added equally to the main signal and its inverse in nodes 17, 19 in a push-push fashion.

The heart of the present invention lies within gain blocks 15 and 18 which sense and amplify the currents of output devices 10 and 11 non-linearly according to an appropriate transfer function, so as to control content of harmonic frequencies therein. Harmonic frequencies are controlled to be within the capability of the amplifier including its frequency response and ability to maintain adequate loop gain during transitions from load to minimum bias current. The transfer function governing the changeover regime may be determined by analysing a range of achievable mathematical functions for their harmonic content. A mathematical function is suitable if on analysis it contains harmonic content that is within the capability of the amplifier. A variety of mathematical functions may meet this requirement but all may not be achievable in a practical sense. A mathematical function is achievable in a practical sense if the function is capable of being constructed with reasonable accuracy and with reasonably few components. A variety of mathematical functions of varying relative suitability is achievable using simple networks of common electronic components. Suitable components to be combined in the networks may include resistors, diodes, bipolar transistors, field effect transistors and the like.

The shaping of characteristics of sensing and amplifying circuits to suit a particular application may be achieved by means of paralleling, or cascading components of known characteristics. Circuit simulation software may be used to quickly create or approximate the characteristic required. Diode or bipolar junctions used in the prior art in an uncalibrated manner provide a benchmark of the current state of the art. The present invention may make use of networks of one or more components in the form of shaping circuits to provide the required transfer function in the bias feedback loop in order to provide controlled harmonic content.

Figure 2:
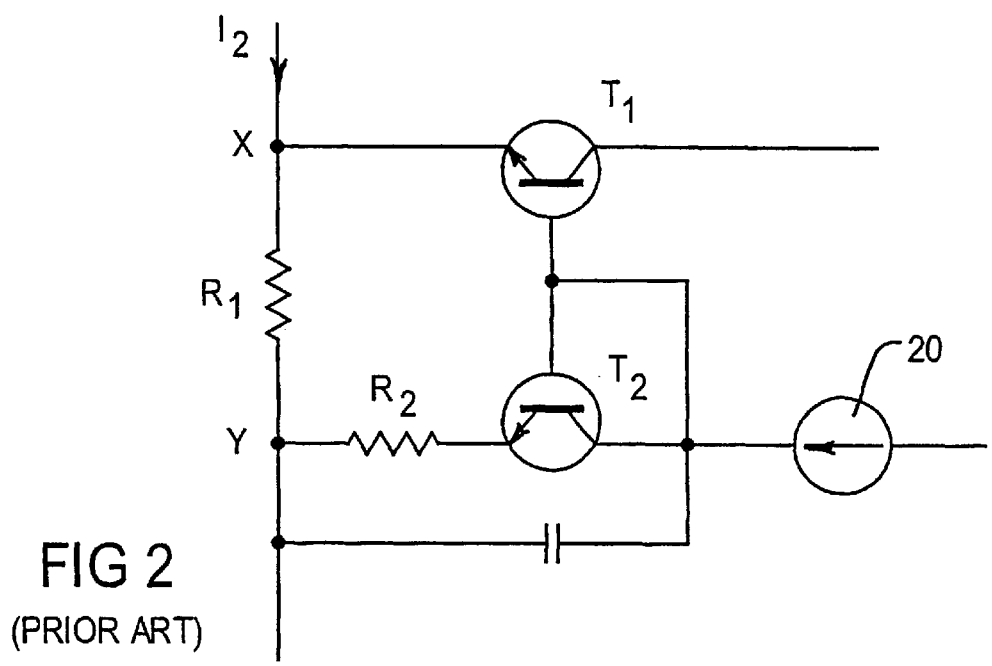
FIG. 2 shows typical prior art bias control sensing and non-linear transform circuit.

FIG. 2 shows a bias control sensing and non-linear transform circuit typical of the prior art. Resistor R1 is the current sensing resistor on one side of the output circuit. The circuit shown would be duplicated for positive and negative sides of the output circuit. Constant current source 20 feeding transistor T2 produces a fixed voltage drop across resistor R2 and a temperature dependent voltage drop across the emitter base junction of transistor T2. Therefore the base of transistor T1 has a temperature compensated voltage reference relative to point Y in the circuit, which biases transistor T1 to a predetermined operating point. As load current $I_2$ from the output device (not shown) increases, the voltage drop across resistor R1 increases causing transistor T1 to turn at least partially off. The turn off is relatively abrupt because the voltage change appears across the base emitter junction of transistor T1, particularly in high power amplifiers where resistor R1 is fixed by other criteria. The relatively abrupt turn off gives rise to harmonic frequency components which are beyond the capability of the amplifier to control errors yielding an estimated distortion of approximately 0.01% at full power. Although the circuit provides a somewhat gradual transition to a minimum conduction state it is not capable of further practical improvement by manipulating values of components. Resistor R1 is constrained to low values in power amplifiers and is limited by the availability of resistors of small fractions of an ohm. Resistor R2 is set by resistor R1. Only insignificant improvements can be achieved by changing transistor types, or changing the current source 20.

Figure 3:
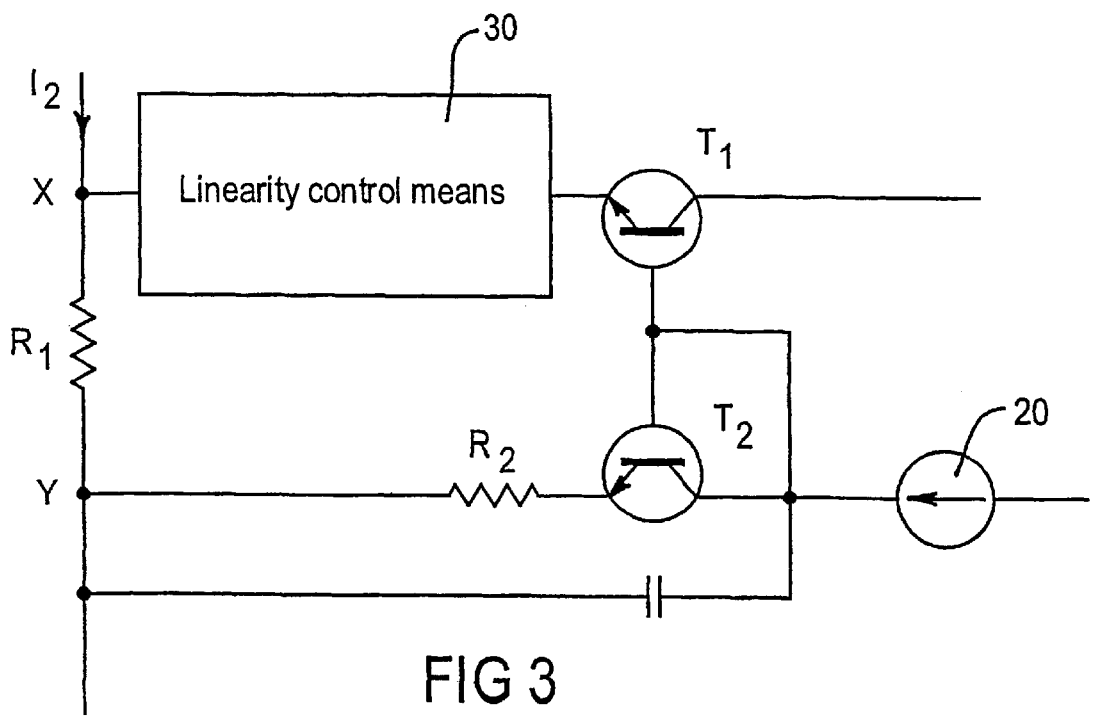
FIG. 3 shows a bias control sensing and non-linear transform circuit including a generic linearity control means according to the present invention.

FIG. 3 shows a bias control sensing and non-linear transform circuit typical of the present invention. The critical feature of the circuit is an added linearity control means 30 that modifies the linearity of the transfer characteristic of the control circuit which has the effect of reducing the highest harmonic frequencies in the currents of the output devices during the transition from full load to minimum bias conduction state.

Figure 4:
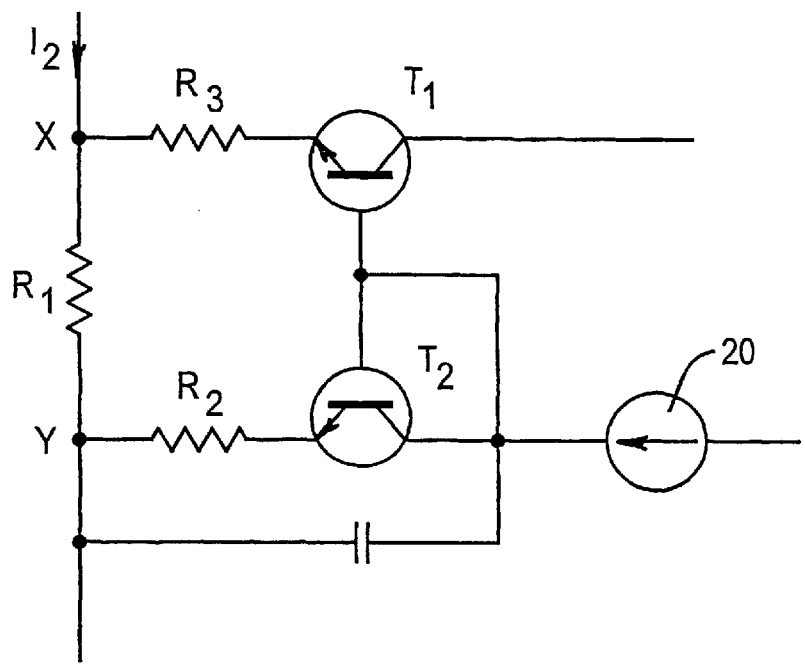
FIG. 4 shows a bias control sensing and non-linear transform circuit including a simple implementation of the linearity control means.

FIG. 4 shows a particular embodiment of a bias control sensing and non-linear transform circuit consistent with the present invention. The linearity control means 30 comprises resistor R3 for moderating relative harmonic content of the transition to a minimum bias conduction state. The voltage drop appears partially across transistor T1 and partially across resistor R3. The resistance of R3 can be chosen to significantly improve the characteristics of the transfer function of the bias control circuit.

Figure 5:
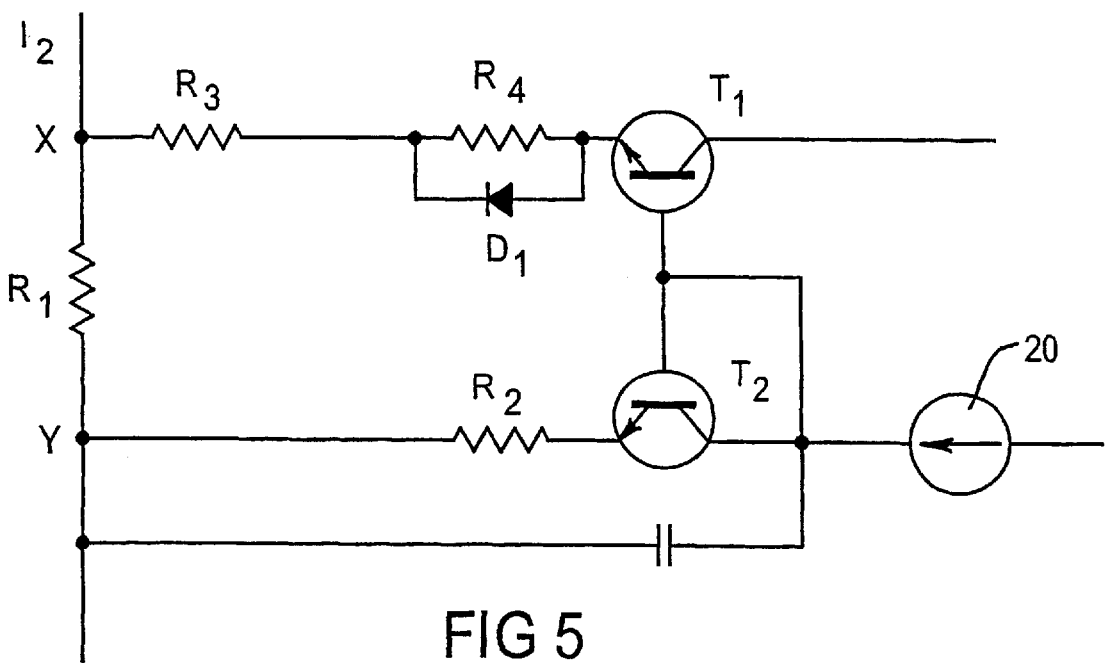
FIG. 5 shows a bias control sensing and non-linear transform circuit including a more advanced implementation of the linearity control means.

FIG. 5 shows a more advanced linearity control means in the form of a network including resistors R3 and R4 and diode D1 for shaping the characteristic of the transfer function of the bias control circuit, resulting in improved control over harmonic frequencies created by the transition from load current to minimum bias current in the output devices.

Figure 6:
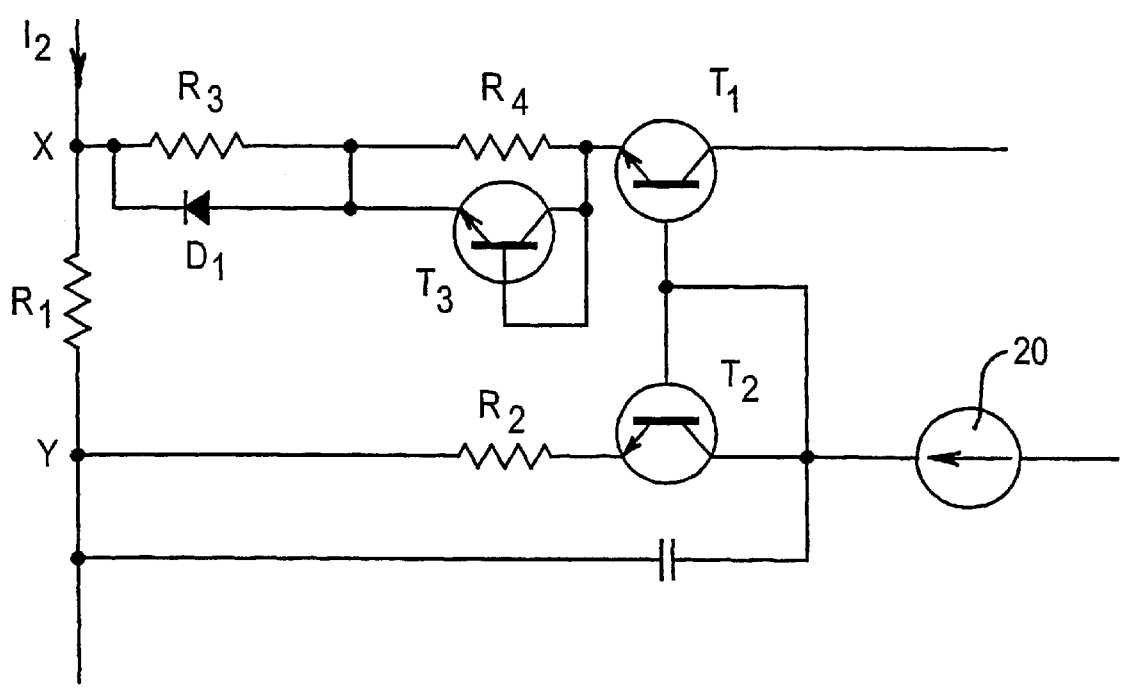
FIG. 6 shows a bias control sensing and non-linear transform circuit including a further advanced implementation of the linearity control means.

FIG. 6 shows a further advanced linearity control means in the form of a network including resistors R3 and R4, diode D1 and transistor T3 for shaping the characteristic of the transfer function of the bias control circuit, resulting in further improved control over harmonic frequencies created by the transition from load current to minimum bias current in the output devices. As can be seen the circuits in FIGS. 5 and 6 are enhanced by the incorporation of the additional linear components R3 and R4 and non-linear components D1 and T3.

Figure 7:
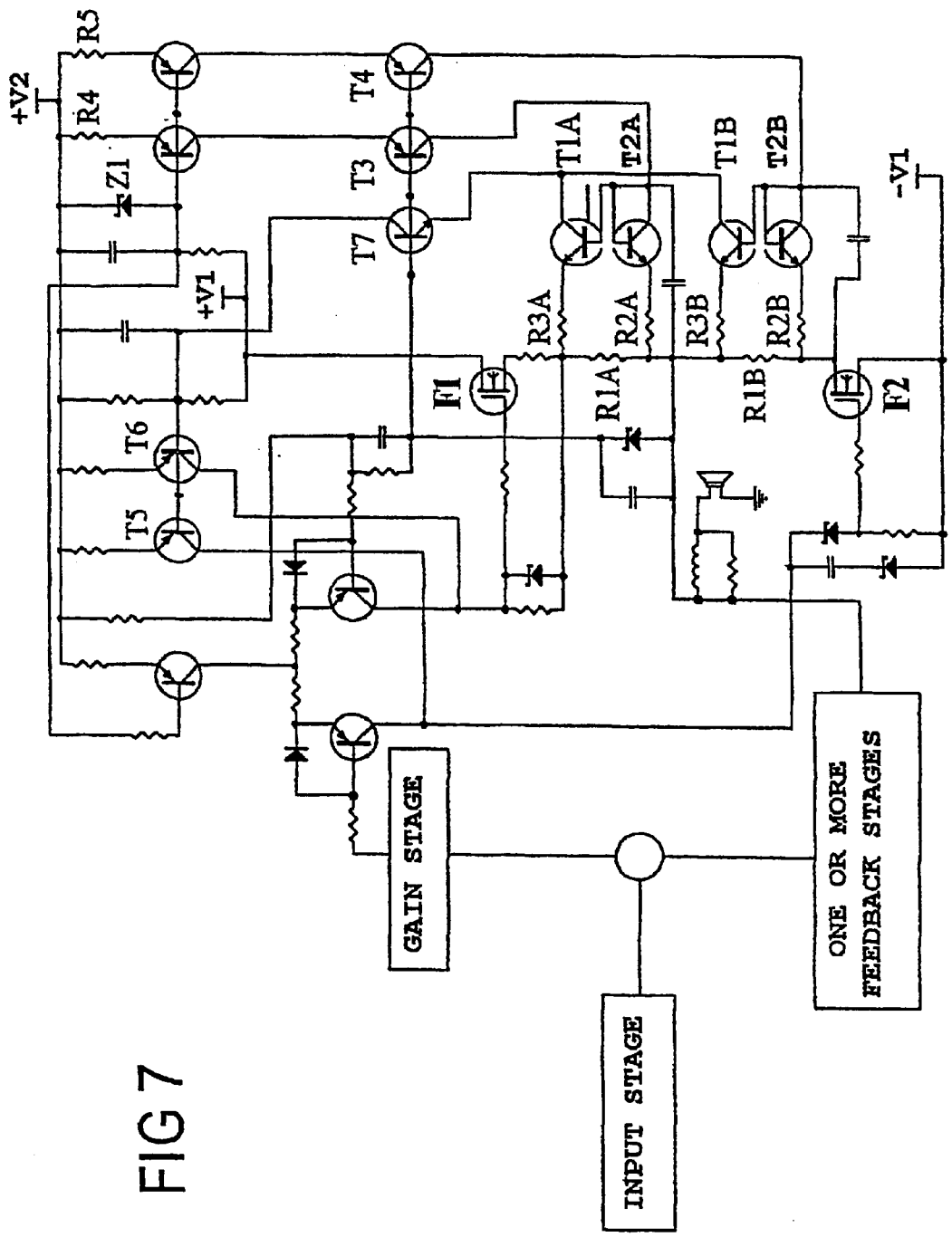
FIG. 7 shows a schematic realization of an amplifier incorporating bias control sensing with non-linear transform according to the present invention.

FIG. 7 shows a schematic diagram of a practical push pull amplifier with bias control sensing and non-linear transform circuits according to the present invention. The amplifier includes an upper bias control circuit including zener diode Z1, resistors R4 and R2A and transistors T3 and T2A to control bias current to upper non-linear component transistor T1A. Resistor R3A controls the gradualness of the transfer function of transistor T1A. Likewise the amplifier includes a lower bias control circuit including zener diode Z1, resistors R5 and R2B and transistors T4 and T2B to control bias current to lower non-linear component transistor T1B. Resistor R3B controls the gradualness of the transfer function of transistor T1B.

Zener diode Z1, resistor R4 and transistor T3 provide a constant current to transistor T2A in the upper bias control circuit, and zener diode Z1, resistor R5 and transistor T4 provide a constant current to transistor T2B in the lower bias control circuit. These currents set the voltages on the bases of transistors T1A and T1B respectively as described with reference to FIGS. 2 to 6. Changes in load current on the positive or negative side result in modified current through transistor T7 which in turn feeds back through transistors T5 and T6 causing adjustment of bias current equally in both output transistors F1 and F2. The adjustments take place continuously throughout the signal cycles and because they are equal in both output transistors F1 and F2 they do not interfere with the main signal. The current through each individual output transistor is smoothed by the superposition of the bias current over the current drawn by the load in such a way that the bias current adds what is required to the waveform to make the transition more gradual.

Finally, it is to be understood that various alterations, modifications and/or additions may be introduced into the constructions and arrangements of parts previously described without departing from the spirit or ambit of the invention. For example in some embodiments the non-linear transform means may be placed in the load current carrying circuit in series with the output devices.

What is claimed is:

1. A push pull amplifier having output devices operating in a mode in which said devices drive a load alternately, said amplifier including bias means for providing a bias current to said devices at all times, said bias means being incorporated in a feedback loop and being arranged such that transitions from load current to minimum bias current in said upper and lower output devices are sufficiently gradual so that harmonic frequencies generated by said transitions are within the capability of said amplifier under all signal conditions, said feedback loop including non-linear transform means for each said upper and lower output device to prevent said bias current reducing to zero and linearity control means for controlling the harmonic frequencies in said upper and lower output devices.

2. A push pull amplifier according to claim 1 wherein said linearity control means includes a network of components.

3. A push pull amplifier according to claim 2 wherein at least one of said components is non-linear.

4. A push pull amplifier according to claim 1 wherein said linearity control means includes at least one resistor.

5. A push pull amplifier according to claim 2 wherein said at least one resistor creates a voltage drop which is sensed as part of an input signal in said feedback loop.

6. A push pull amplifier according to claim 1 wherein each non-linear transform means is in series with the respective upper and lower output device.

7. A push pull amplifier according to claim 1 wherein each non-linear transform means is separate from load current carrying circuits of said amplifier.

* * * * *